(12) United States Patent
Man

(10) Patent No.: US 8,803,111 B2
(45) Date of Patent: Aug. 12, 2014

(54) SAMPLE PREPARATION APPARATUS AND SAMPLE PREPARATION METHOD

(71) Applicant: Hitachi High-Tech Science Corporation, Tokyo (JP)

(72) Inventor: Xin Man, Tokyo (JP)

(73) Assignee: Hitachi High-Tech Science Corporation (JP)

( * ) Notice: Subject to any disclaimer, the term of this patent is extended or adjusted under 35 U.S.C. 154(b) by 0 days.

(21) Appl. No.: 13/840,117

(22) Filed: Mar. 15, 2013

(65) Prior Publication Data

US 2013/0241091 A1   Sep. 19, 2013

(30) Foreign Application Priority Data

Mar. 16, 2012 (JP) ................. 2012-060962
Nov. 16, 2012 (JP) ................. 2012-252639

(51) Int. Cl.
*G01N 23/225* (2006.01)
*H01J 37/28* (2006.01)

(52) U.S. Cl.
USPC ...... 250/492.22; 250/305; 250/307; 250/310; 250/492.21

(58) Field of Classification Search
USPC ............ 250/305, 307, 310, 492.21, 492.22
See application file for complete search history.

(56) References Cited

U.S. PATENT DOCUMENTS

| | | | |
|---|---|---|---|
| 7,285,778 B2 * | 10/2007 | Baur et al. ............... 250/310 |
| 7,297,965 B2 * | 11/2007 | Kidron et al. ............. 250/492.2 |
| 7,348,556 B2 * | 3/2008 | Chitturi et al. ............ 250/309 |
| 7,586,093 B2 * | 9/2009 | Feuerbaum ................ 250/311 |
| 7,659,506 B2 * | 2/2010 | Avinun-Kalish et al. .... 250/304 |
| 7,718,979 B2 * | 5/2010 | Knowles .................. 250/492.1 |
| 7,804,068 B2 * | 9/2010 | Notte, IV ................. 250/309 |
| 7,829,870 B2 * | 11/2010 | Frosien .................... 250/492.1 |
| 8,134,124 B2 * | 3/2012 | Blackwood et al. ........ 250/304 |
| 8,191,168 B2 * | 5/2012 | Man et al. ................. 850/18 |
| 8,274,049 B2 * | 9/2012 | Tanaka et al. ............. 250/311 |
| 8,455,821 B2 * | 6/2013 | Arjavac et al. ............ 250/307 |
| 8,536,525 B2 * | 9/2013 | Blackwood et al. ........ 250/304 |
| 8,563,944 B2 * | 10/2013 | Shichi et al. .............. 250/423 F |
| 2006/0011868 A1 * | 1/2006 | Kidron et al. .............. 250/492.22 |
| 2011/0186734 A1 * | 8/2011 | Hasuda et al. ............. 250/307 |
| 2012/0200007 A1 * | 8/2012 | Straw et al. ............... 264/400 |
| 2013/0143412 A1 * | 6/2013 | Moriarty et al. ........... 438/759 |
| 2013/0146765 A1 * | 6/2013 | Kitayama et al. .......... 250/307 |
| 2013/0214458 A1 * | 8/2013 | Suzuki ..................... 264/488 |
| 2013/0241091 A1 * | 9/2013 | Man ........................ 264/1.36 |
| 2013/0248710 A1 * | 9/2013 | Sato et al. ................. 250/310 |
| 2013/0248735 A1 * | 9/2013 | Man et al. ................. 250/442.11 |

FOREIGN PATENT DOCUMENTS

JP   2011159483   8/2011

* cited by examiner

*Primary Examiner* — David A Vanore
(74) *Attorney, Agent, or Firm* — Adams & Wilks

(57) ABSTRACT

Provided is an apparatus for preparing a sample including: a sample stage that supports a sample; a focused ion beam column that applies a focused ion beam to the same sample and processes the sample; and an irradiation area setting unit that sets a focused-ion-beam irradiation area including a first irradiation area used to form an observation field irradiated with an electron beam in order to detect backscattered electrons and a second irradiation area used to form a tilted surface tilted with respect to the normal line of the observation field with an angle of 67.5° or more and less than 90°.

20 Claims, 6 Drawing Sheets

SAMPLE PREPARATION APPARATUS AND SAMPLE PREPARATION METHOD

This application claims priority from Japanese Patent Application No. 2012-060962 filed on Mar. 16, 2012 and Japanese Patent Application No. 2012-252639 filed on Nov. 16, 2012, the entire subject-matter of which is incorporated herein by reference.

BACKGROUND

1. Technical Field

The present invention relates to a sample preparation apparatus and method for preparing a sample used to observe a diffraction pattern of backscattered electrons emitted from the sample irradiated with an electron beam.

2. Related Art

There is conventionally known a method in which a sample is scanned and irradiated with an electron beam and backscattered electrons from the sample are detected to measure an electron back-scattering pattern (EBSP) using a scanning electron microscope. Information on the crystal orientation of the sample can be obtained by the method.

There is known another method in which a cut surface formed by a focused ion beam is irradiated with an electron beam and backscattered electrons generated thereby are detected to form an EBSP of the cut surface (refer to JP-A-2011-159483).

In the related art, it is necessary to expose a desired target of observation by focused-ion-beam processing if the target of observation is buried in a sample. The related art has a problem in that it is difficult to obtain an accurate diffraction pattern, even if the target of observation is exposed, when the sample processed has a shape that blocks the optical paths of backscattered electrons around the target of observation.

SUMMARY

Under such circumstances, the present invention is aimed at providing a sample preparation apparatus and a sample preparation method for forming an accurate EBSP.

In view of the foregoing, illustrative aspects of the present invention provide the following means:

A sample preparation apparatus according to the invention includes a sample stage configured to support a sample, a focused ion beam column configured to apply a focused ion beam to the sample and process the sample, and an irradiation area setting unit configured to set a focused-ion-beam irradiation area including a first irradiation area for forming an observation field (7c), which is to be irradiated with an electron beam in order to detect backscattered electrons and a second irradiation area for forming a tilted surface, which is connected to the observation field and the surface of the sample, and which is tilted with respect to the normal direction of the observation field with an angle of 67.5° or more and less than 90°.

With this structure, it is possible to prepare a sample having a shape that does not block backscattered electrons on the optical paths to a detector through which backscattered electrons pass, the backscattered electrons being generated by applying an electron beam to the observation field.

With a sample observing apparatus according to the invention, it is possible to form an EBSP of the desired target of observation in the sample accurately.

DETAILED DESCRIPTION

Embodiments of a sample preparation apparatus and a sample preparation method according to the present invention will be described below.

Figure 1:
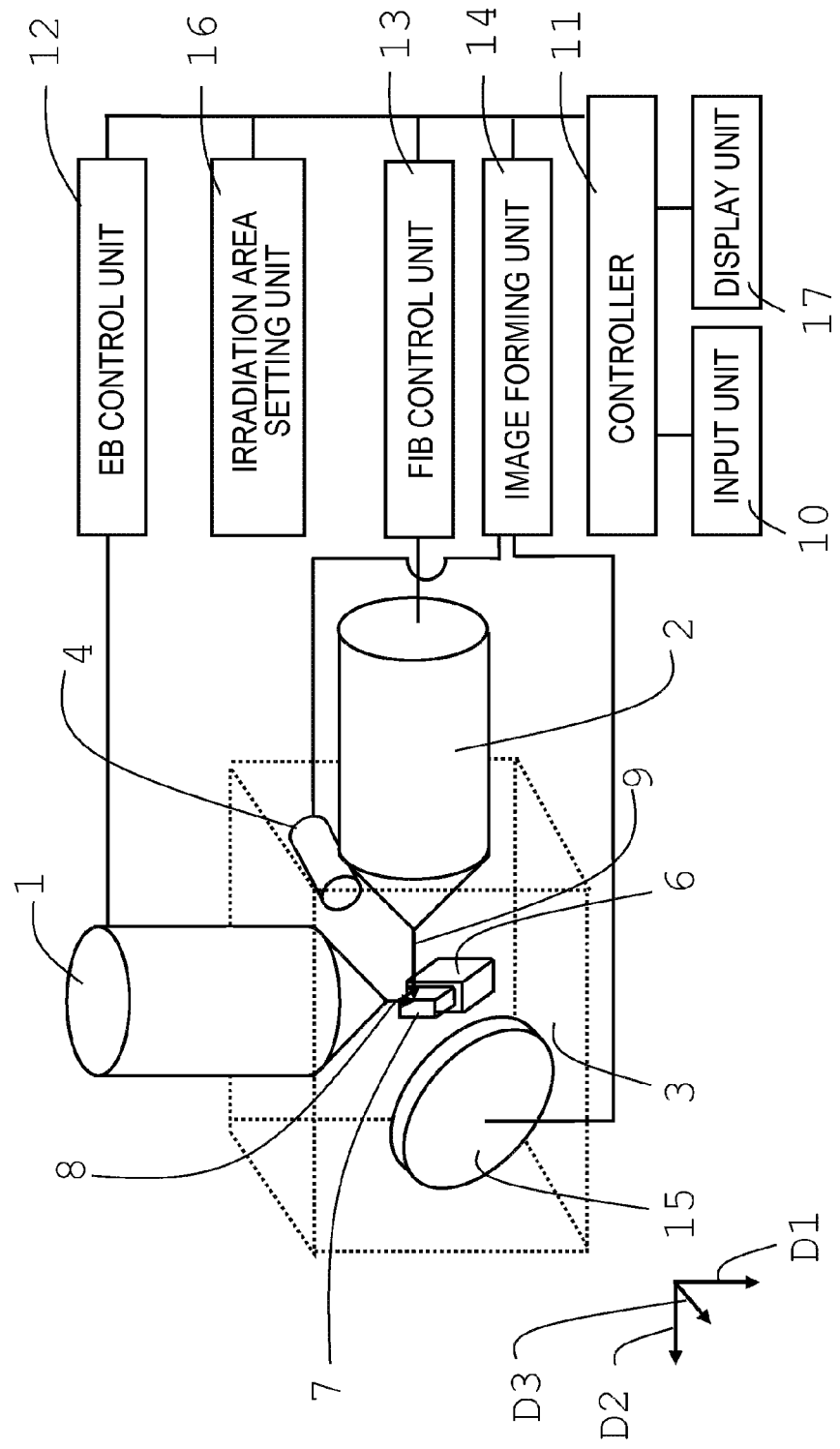
FIG. 1 is a configuration diagram of a sample preparation apparatus according to an embodiment of the present invention.

The sample preparation apparatus is described. The sample preparation apparatus includes an electron beam (EB) column 1, a focused ion beam (FIB) column 2, and a sample chamber 3 as illustrated in FIG. 1. The EB column 1 applies an electron beam 8 to a sample 7 that is set in the sample chamber 3 and the FIB column 2 applies an ion beam 9 to the same sample 7. The EB column 1 and the FIB column 2 are arranged so that their beam axes cross at right angles on the sample 7.

The sample preparation apparatus further includes a secondary electron detector 4. The secondary electron detector 4 detects secondary electrons emitted from the sample 7 irradiated with the electron beam 8 or the ion beam 9. The sample preparation apparatus also includes a backscattered electron detector 15. The backscattered electron detector 15 detects backscattered electrons emitted from the sample 7 irradiated with the electron beam 8.

In the sample preparation apparatus, an EB beam-axis direction D1 of the EB column 1 and a FIB beam-axis direction D2 of the FIB column 2 cross at right angles. Here, a direction crossing at right angles with both the EB beam-axis direction D1 and FIB beam-axis direction D2 is referred to as a backscattered electron emission direction D3, among the directions to which backscattered electrons are emitted from the sample 7. The backscattered electron detector 15 is disposed at a position at which backscattered electrons emitted in the backscattered electron emission direction D3 can be detected.

The sample preparation apparatus further includes a sample stage 6 that supports the sample 7. The incident angle of the electron beam 8 to the sample 7 can be changed by tilting the sample stage 6.

The sample preparation apparatus further includes an EB control unit 12, a FIB control unit 13, an image forming unit 14, and a display unit 17. The EB control unit 12 sends an irradiation signal to the EB column 1 to cause the EB column 1 to apply the electron beam 8. The FIB control unit 13 sends an irradiation signal to the FIB column 2 to cause the FIB column 2 to apply the ion beam 9.

The image forming unit 14 forms data corresponding to a scanning electron microscope (SEM) image on the basis of a signal causing the EB control unit 12 to scan the electron beam 8 and a secondary electron signal detected by the secondary electron detector 4. The display unit 17 displays the SEM image. The image forming unit 14 forms data corresponding to a scanning ion microscope (SIM) image on the basis of a signal causing the FIB control unit 13 to scan the ion beam 9 and a secondary electron signal detected by the secondary electron detector 4. The display unit 17 displays the SIM image. In addition, the image forming unit 14 forms data corresponding to an EBSP on the basis of a detected signal detected by the backscattered electron detector 15. The display unit 17 displays the EBSP.

The sample preparation apparatus further includes an input unit 10 and a controller 11. The input unit 10 allows an operator to input conditions regarding the control of the apparatus. The input unit 10 transmits the information input thereto to the controller 11. The controller 11 transmits control signals to the EB control unit 12, the FIB control unit 13, the image forming unit 14, and the display unit 17 to operate the sample preparation apparatus.

In the embodiment, a desired target of observation in the sample 7 is exposed by etching with the ion beam 9 to form an observation field. It is necessary that the observation field be irradiated with the electron beam 8 and the backscattered electrons emitted thereby be detected by the backscattered electron detector 15 to form an EBSP of the observation field. In other words, the sample 7 should be fabricated so that the electron beam 8 is applied to the observation field and the backscattered electrons reach the backscattered electron detector 15 from the observation field without the optical path being blocked. Accordingly, the sample preparation apparatus includes an irradiation area setting unit 16 that sets an area (irradiation area) to be irradiated with the ion beam 9 to fabricate the sample 7 in a shape to form an EBSP.

The irradiation area setting unit 16 stores therein the irradiation area of the ion beam 9 for forming an EBSP and irradiation conditions. The stored irradiation area is set on a desired position in a SIM image displayed on the display unit 17. The irradiation area setting unit 16 sends the irradiation area having been set and the irradiation conditions having been stored to the FIB control unit 13 to apply the ion beam 9.

Figure 2A:
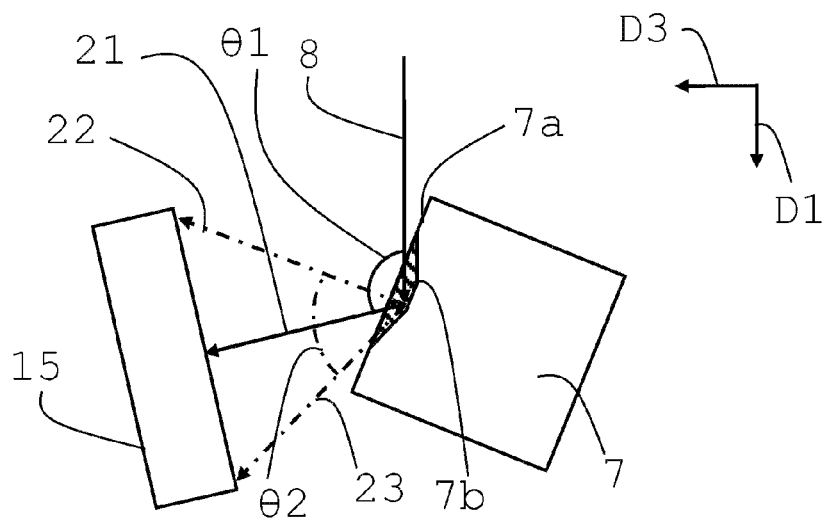
FIGS. 2A and 2B are explanatory views of a method for preparing a sample according to an embodiment of the present invention.

Here, the shape of the sample adapted to detection of backscattered electrons with the backscattered electron detector 15 is described with reference to FIG. 2A. FIG. 2A is a sectional view of the sample 7 and the backscattered electron detector 15 in a plane formed by the EB beam-axis direction D1 and the backscattered electron emission direction D3. Backscattered electrons that are needed to form an EBSP are emitted and spread to a range of 70° from end to end whose center direction has an angle of 100° to the electron beam 8 entering the sample 7. In other words, when a center direction 21 is along the center axis of the range to which the backscattered electrons are emitted and spread, an angle θ1 between the center direction 21 and the beam direction of the electron beam 8 is 100°. The backscattered electron detector 15 detects backscattered electrons emitted to a range having a central angle θ2 of 70° around the center direction 21, that is, a range defined by a backscattered electron emission direction 22 and a backscattered electron emission direction 23. It is possible to form a more accurate EBSP by detecting backscattered electrons emitted to the range.

The sample preparation apparatus makes a fabricated groove 7b. The fabricated groove 7b allows an observation field 7c provided by exposing a desired target of observation to be irradiated with the electron beam 8. In addition, the fabricated groove 7b does not block the optical paths of backscattered electrons to the backscattered electron detector 15. The backscattered electrons are emitted from the observation field 7c to the range surrounded by the backscattered electron emission directions 22 and 23 and having a center line 21 as the center axis. The irradiation area setting unit 16 sets an ion beam irradiation area and irradiation conditions to form the fabricated groove 7b.

The shape of the fabricated groove 7b is described with reference to FIG. 2B. The sample 7 fabricated has the observation field 7c parallel with a surface 7a of the sample 7. The sample 7 also has a tilted surface 7d and a tilted surface 7e that are connected to the surface 7a and the observation field 7c and tilted with respect to the observation field 7c. The tilted surface 7d and the tilted surface 7e are formed so that the observation field 7c is located therebetween. The tilted surface 7e tilts with respect to the normal direction 24 of the observation field 7c by a tilt angle θ3 of 70°, for example. Here, when the tilt angle θ3 is 67.5° or more and less than 90°, the EBSP of the observation field 7c can be formed. Accordingly, the tilt angle θ3 may be 67.5°, which is a half of the angle of 135° formed by the incident direction of the electron beam 8 and the backscattered electron emission direction 23. The tilted surface 7d is also formed to have a tilted angle of 67.5° or more and less than 90° with respect to the normal direction of the observation field 7c.

The fabricated groove 7b formed to have the shape mentioned above enables to form a more accurate EBSP. In addition, the provision of the fabricated groove 7b can reduce the machining steps to expose the observation field 7c than etching on the entire surface 7a of the sample 7 to expose a desired target of observation. Thus, the machining time can be reduced remarkably.

Figure 2B:
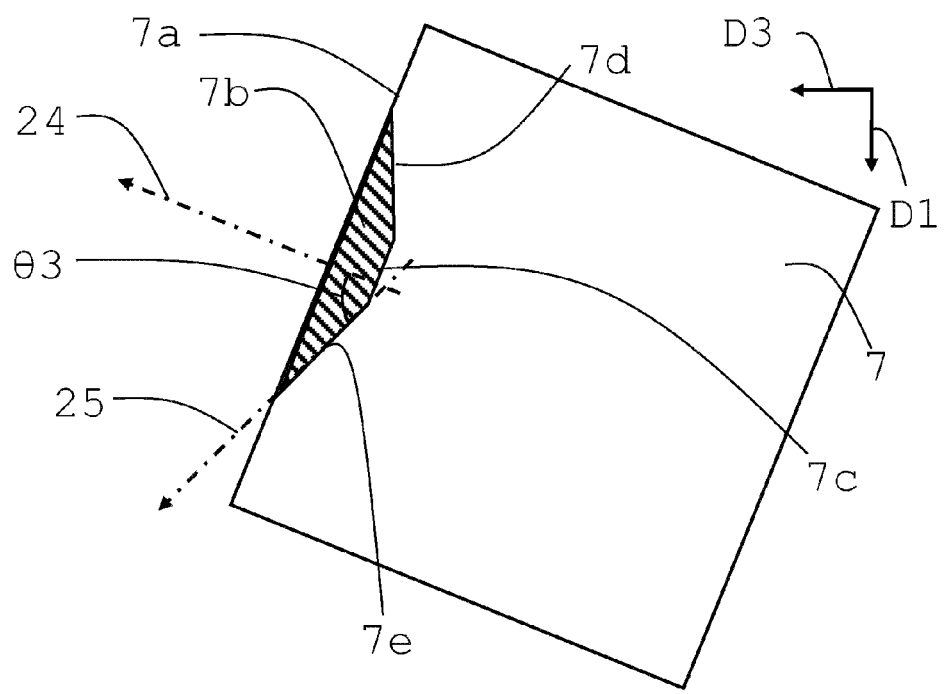
Figure 3:
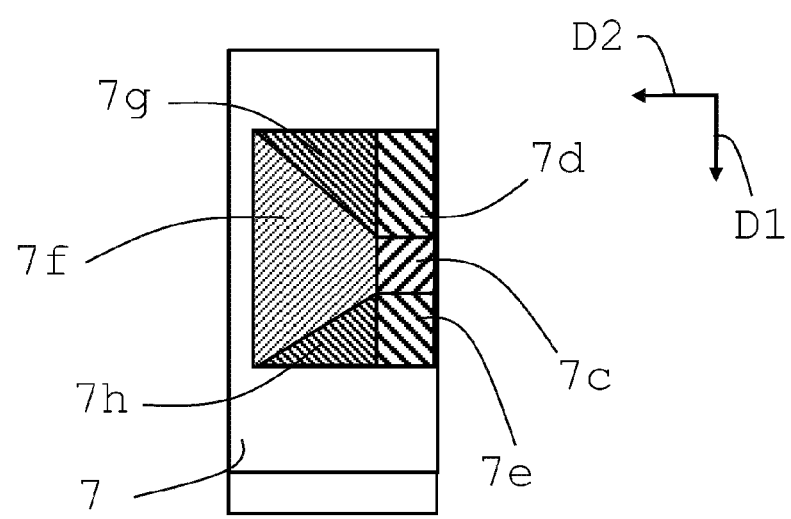
FIG. 3 is an explanatory view of the method for preparing a sample according to the embodiment of the present invention.

FIG. 3 is an explanatory view of the sample 7 illustrated in FIG. 2B. FIG. 3 shows that a tilted surface 7f, a tilted surface 7g, and a tilted surface 7h are formed around the observation field 7c. The tilted surface 7f, the tilted surface 7g, and the tilted surface 7h are shaped by exposing the tilted surface 7d, the tilted surface 7e, and the observation field 7c and applying additional fabrication that applies an ion beam to the sample 7. This enables the backscattered electron detector 15 to detect more backscattered electrons emitted from the observation field 7c without being blocked.

The setting procedure of the irradiation area of the ion beam 9 is described with reference to FIG. 4.

Figure 4A:
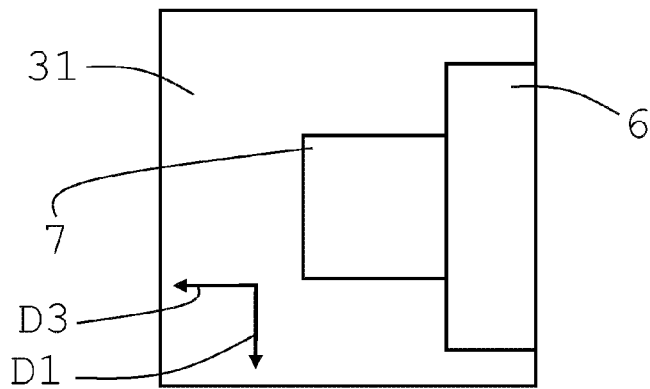
FIGS. 4A to 4C are explanatory views of the method for preparing a sample according to the embodiment of the present invention.

FIG. 4A shows a SIM image 31 of the sample 7 viewed from the FIB beam-axis direction D2. The EB beam-axis direction D1 and the backscattered electron emission direction D3 are indicated for reference.

Figure 4B:
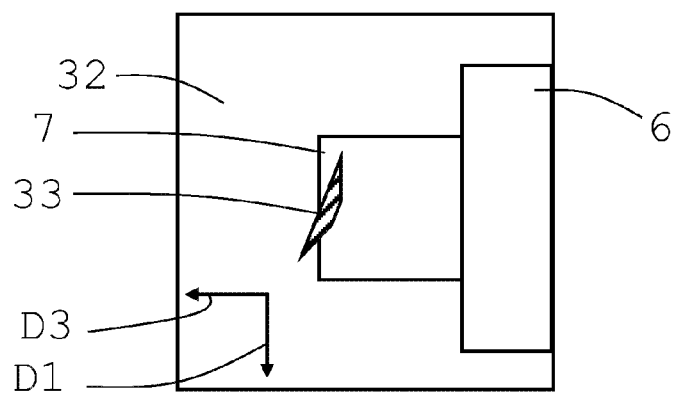

An operator causes the display unit 17 to overlay an irradiation area 33 on a SIM image 32 displayed thereon as illustrated in FIG. 4B. The irradiation area 33 shows the irradiation area of the ion beam 9 used to form the fabricated groove 7b on the sample 7. The irradiation area setting unit 16 displays the irradiation area 33 on the SIM image 32 in an orientation that enables the electron beam 8 to enter the observation field and also enables backscattered electrons necessary to form an EBSP to be emitted to the backscattered electron detector 15, on the basis of the arrangement of the EB column 1 and the backscattered electron detector 15.

Figure 4C:
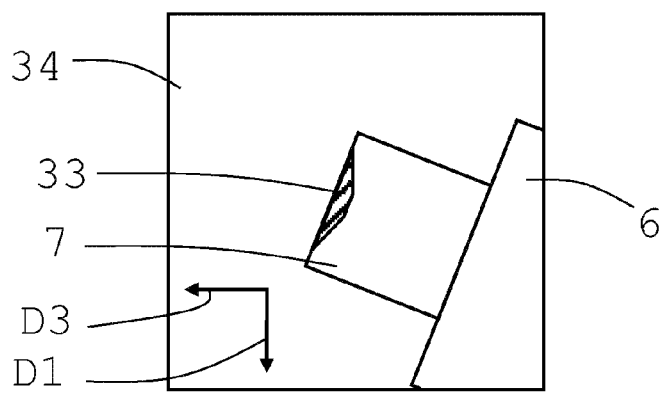

Thereafter, the operator translates the irradiation area 33 on the SIM image 32 or moves the sample stage 6 to adjust the positions of the sample 7 and the irradiation area 33 on the SIM image 34 as illustrated in FIG. 4C. This makes it possible to set the irradiation area of the ion beam 9 used to form the fabricated groove 7b on the sample 7 for observing an EBSP. The irradiation conditions of the ion beam 9 include a condition for ion beam irradiation with a uniform dose on the irradiation area 33. The irradiation conditions of the ion beam 9 further include a condition whereby a smaller dose of the ion beam is applied to the observation field 7c so that the tilted surface 7f, the tilted surface 7g, and the tilted surface 7h are tilted with respect to the observation field 7c, and a larger dose of the ion beam is applied as the distance from the observation field 7 increases, or as the distance from the surface 7a decreases.

Figure 5:
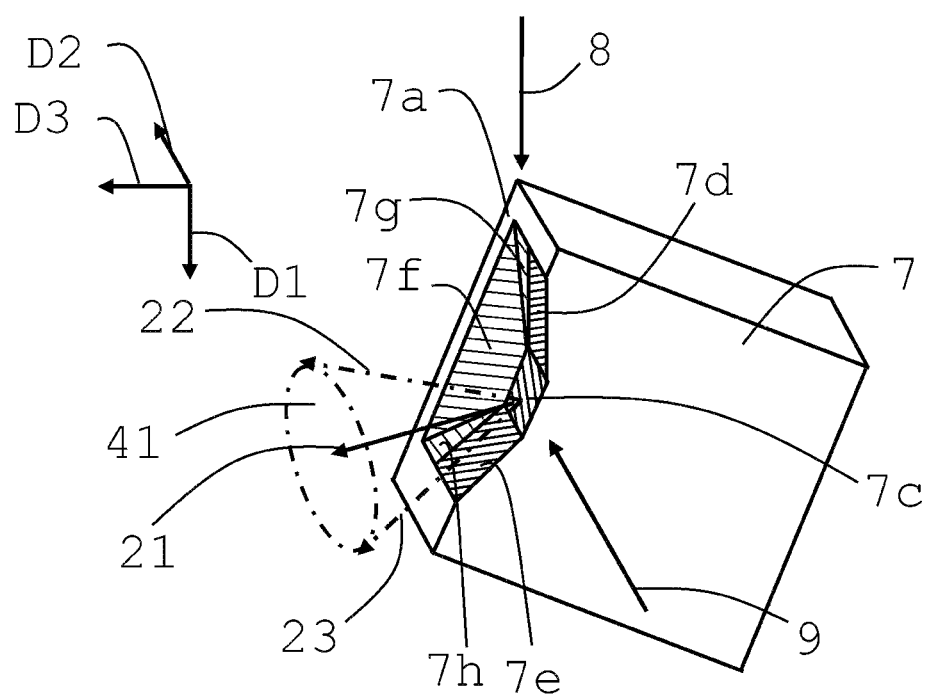
FIG. 5 is an explanatory view of the method for preparing a sample according to the embodiment of the present invention.

The irradiation area 33 having been set in a manner described above is irradiated with the ion beam 9 with a uniform dose to fabricate the sample 7. The ion beam 9 enters from a direction that crosses each of the EB beam-axis direction D1 and the backscattered electron emission direction D3 at right angles (e.g., from a vertical direction with respect to the normal direction 24 of the observation field 7c and the EB beam-axis direction D1), as illustrated in FIG. 5. This fabrication forms the observation field 7c, the tilted surface 7d, and the tilted surface 7e. The tilted surface 7f, the tilted surface 7g, and the tilted surface 7h are additionally formed by ion beam irradiation with the adjusted dose of the ion beam in a manner described above. This enables the electron beam 8 to be applied to the sample 7 and the backscattered electron detector 15 to detect backscattered electrons that are necessary to form an EBSP, the backscattered electrons emitted from the observation field 7c to the range surrounded by the backscattered electron emission direction 22 and the backscattered electron emission direction 23. As a result, an accurate EBSP can be formed.

Figure 6A:
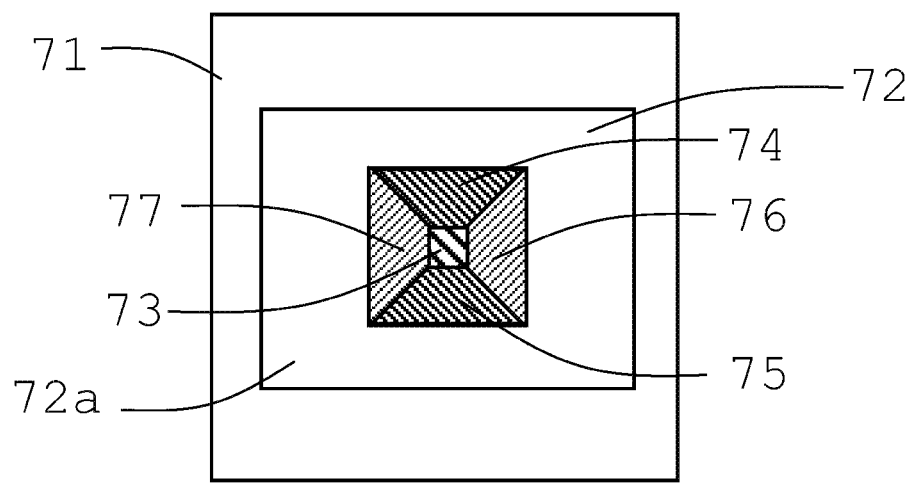
FIGS. 6A and 6B are explanatory views of another method for preparing a sample according to the embodiment of the present invention.

A method for fabricating the sample 7 by applying the ion beam 9 from the direction crossing each of the EB beam-axis direction D1 and the backscattered electron emission direction D3 at right angles has been described. It is also possible to fabricate a sample by applying an ion beam from the vertical direction with respect to the surface of the sample. Another method for preparing a sample will now be described with reference to FIG. 6 in which the surface of the sample is irradiated with the ion beam from the vertical direction with respect to the surface of the sample. FIG. 6A shows a SIM image 71 that is observed when a surface 72a of a sample 72 is scanned by and irradiated with the ion beam 9 from the vertical direction. An operator sets the irradiation area of the ion beam 9 on the SIM image 71. The irradiation area of the ion beam 9 includes an observation field irradiation area 73 and tilted surface irradiation areas 74, 75, 76, and 77. The irradiation condition of the observation field irradiation area 73 is a condition for unifying the dose of the ion beam 9 in the field. The irradiation conditions of the tilted surface irradiation areas 74, 75, 76, and 77 is a condition under which a larger dose of the ion beam is applied to the observation field 72c and a smaller dose of the ion beam is applied as the distance from the observation field 72c increases, or as the distance from the surface 72a decreases so that the tilted surface 72d, the tilted surface 72f, and the tilted surface 72g are tilted with respect to the observation field 72c.

Figure 6B:
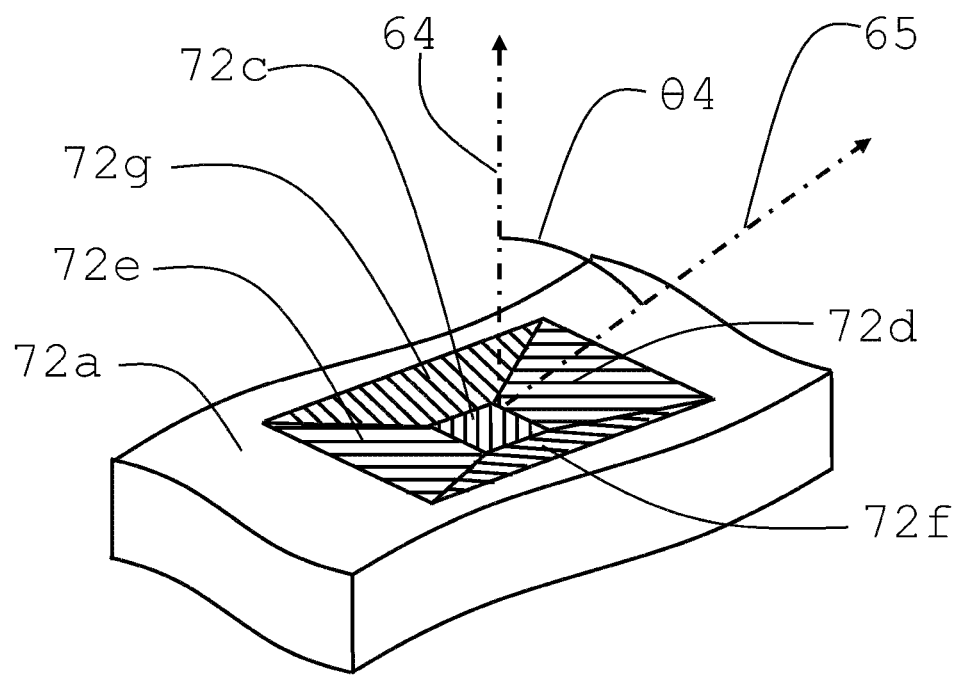

The sample is fabricated in the shape illustrated in FIG. 6B by these irradiation conditions. The sample 72 includes the observation field 72c parallel with the surface 72a and the tilted surface 72d, the tilted surface 72e, the tilted surface 72f, and the tilted surface 72g adjacent to the observation field 72c. The tilted surface 72d is a tilted surface that has an in-plane direction 65 tilted with respect to a normal direction 64 of the observation field 72c by an angle θ4 of 70°. The tilted surface 72e, the tilted surface 72f, and the tilted surface 72g are also tilted with respect to the normal direction 64 of the observation field 72c at 70°. This enables the backscattered electron detector 15 to detect more backscattered electrons emitted from the observation field 72c without being blocked.

What is claimed is:

1. A sample preparation apparatus comprising:
    a sample stage configured to support a sample;
    a focused ion beam column configured to apply a focused ion beam to the sample and process the sample; and
    an irradiation area setting unit configured to set a focused-ion-beam irradiation area comprising:
        a first irradiation area for forming an observation field, which is to be irradiated with an electron beam in order to detect backscattered electrons; and
        a second irradiation area for forming a tilted surface, which is connected to the observation field and a surface of the sample, and which is tilted with respect to a normal direction of the observation field at a tilt angle of 67.5° or more and less than 90°.

2. The sample preparation apparatus according to claim 1, wherein the second irradiation area is an irradiation area for forming a pair of the tilted surfaces adjacent to the observation field.

3. The sample preparation apparatus according to claim 1, wherein the second irradiation area is an irradiation area for forming a quartet of the tilted surfaces adjacent to the observation field.

4. The sample preparation apparatus according to claim 1, further comprising:
    an electron beam column configured to apply an electron beam; and
    a scattered electron detector configured to detect the backscattered electrons emitted from the sample irradiated with the electron beam.

5. The sample preparation apparatus according to claim 4, wherein the irradiation area setting unit is configured to set the focused-ion-beam irradiation area so as to apply the electron beam to the observation field.

6. The sample preparation apparatus according to claim 4, wherein the focused ion beam column is arranged such that the focused ion beam and the electron beam cross at right angles.

7. The sample preparation apparatus according to claim 4, wherein the scattered electron detector is configured to detect backscattered electrons emitted from the sample within a given spread angle, the electron beam column is configured to apply the electron beam along a beam axis to the sample, and the angle between the center axis of the spread angle and the electron beam axis is 100°.

8. The sample preparation apparatus according to claim 4, wherein the scattered electron detector is configured to detect backscattered electrons emitted from the sample within a given spread angle range, the electron beam column is configured to apply the electron beam along a beam axis to the sample, and the tilt angle is equal to half the angle between the electron beam axis and one end of the spread angle range.

9. The sample preparation apparatus according to claim 1, wherein the irradiation area setting unit is configured set the irradiation area on a desired position in a display image of the sample.

10. A sample preparation method for preparing a sample used to observe a diffraction pattern of backscattered electrons, the method comprising:
    forming an observation field, which is to be irradiated with an electron beam for detecting the backscattered electrons, by applying a focused ion beam to the sample; and
    forming a tilted surface, which is connected to the observation field and the surface of the sample, and which is tilted with respect to a normal line of the observation field with an angle of 67.5° or more and less than 90° by applying the focused ion beam to the sample.

11. The sample preparation method according to claim 10, wherein the forming of the observation field and the forming of the tilted surface comprise applying the focused ion beam to the sample from a vertical direction with respect to the observation field.

12. The sample preparation method according to claim 11, wherein the forming of the observation field comprises applying a first dose of the focused ion beam to the sample, and
wherein the forming of the tilted surface comprises applying a second dose of the focused ion beam, which becomes smaller than the first dose thereof as a distance from the observation field increases.

13. The sample preparation method according to claim 10, wherein the forming of the observation field and the forming of the tilted surface comprise applying the focused ion beam to the sample from a vertical direction with respect to the normal direction of the observation field and a beam axis direction of the electron beam.

14. The sample preparation method according to claim 13, wherein the forming of the observation field comprise applying a first dose of the focused ion beam to the sample, and
wherein the forming of the tilted surface comprises applying a second dose of the focused ion beam, which becomes larger than the first dose thereof as a distance from the observation field increases.

15. A sample preparation apparatus comprising:
a sample stage configured to support a sample;
a focused ion beam column configured to irradiate the sample with a focused ion beam to process the sample; and
an irradiation area setting unit configured to set, for the sample, first and second irradiation areas that can be irradiated by the focused ion beam to process the sample to a shape that forms an electron back-scattering pattern when irradiated with an electron beam, the first irradiation area corresponding to an observation field of the sample which can be irradiated with an electron beam to generate backscattered electrons, and the second irradiation area corresponding to a tilted surface of the sample which extends from the observation field to a surface of the sample and which is tilted with respect to a direction normal to the observation field at an angle of 67.5° or more and less than 90°.

16. A sample preparation apparatus according to claim 15; wherein the second irradiation area corresponds to two tilted surfaces opposite each other on opposite sides of the observation field.

17. A sample preparation apparatus according to claim 15; wherein the second irradiation area corresponds to four tilted areas, two of which are opposite each other on opposite sides of the observation field, and the other two of which are opposite each other on different opposite sides of the observation field.

18. A sample preparation apparatus according to claim 17; wherein the four tilted areas surround the observation field.

19. A sample preparation apparatus according to claim 18; wherein the observation field is square and the four tilted areas all have the same shape.

20. A sample preparation apparatus according to claim 15; further comprising an electron beam column configured to irradiate the sample with an electron beam; and a scattered electron detector configured to detect backscattered electrons emitted from the sample irradiated with the electron beam.

* * * * *